(12) United States Patent
Waschura et al.

(10) Patent No.: US 7,788,571 B2
(45) Date of Patent: Aug. 31, 2010

(54) METHOD AND APPARATUS FOR USING DUAL BIT DECISIONS TO MEASURE BIT ERRORS AND EVENT OCCURRENCES

(75) Inventors: Thomas E. Waschura, Menlo Park, CA (US); Robert L. Verity, Menlo Park, CA (US)

(73) Assignee: SyntheSys Research, Inc., Menlo Park, CA (US)

( * ) Notice: Subject to any disclaimer, the term of this patent is extended or adjusted under 35 U.S.C. 154(b) by 1114 days.

(21) Appl. No.: 11/009,381

(22) Filed: Dec. 10, 2004

(65) Prior Publication Data

US 2007/0033448 A1 Feb. 8, 2007

Related U.S. Application Data

(60) Provisional application No. 60/528,694, filed on Dec. 10, 2003.

(51) Int. Cl.
*H03M 13/03* (2006.01)
(52) U.S. Cl. ........................ 714/795; 370/333
(58) Field of Classification Search ................ 714/795
See application file for complete search history.

(56) References Cited

U.S. PATENT DOCUMENTS 5,459,743 A * 10/1995 Fukuda et al. ............... 714/819
5,703,409 A * 12/1997 Fukumitsu et al. .......... 714/704
6,018,554 A * 1/2000 Glover ....................... 375/345
6,141,388 A * 10/2000 Servais et al. .............. 375/262
7,032,139 B1 * 4/2006 Iryami et al. ............... 714/704
7,069,488 B2 * 6/2006 Moll et al. .................. 714/736
7,209,671 B1 * 4/2007 Hayee et al. ................ 398/207
2004/0052318 A1 * 3/2004 Traeber ...................... 375/341

* cited by examiner

*Primary Examiner*—Scott T Baderman
*Assistant Examiner*—Enam Ahmed
(74) *Attorney, Agent, or Firm*—Douglas A. Chaikin (57) ABSTRACT

An apparatus and method for measuring errors and event occurrences in a multi-valued data stream by using a dual decision bit error rate tester is disclosed. The Bit error rate tester (BERT) includes a plurality of decision circuits operative to provide a respective bit decision output signal in response to an input signal. The bit decision output signal magnitude information of a signal under test as measured over a sample window period. A comparator circuit is coupled to each of the plurality of decision circuits, and is operative to provide an event occurrence signal in response to the bit decision output signals from each of the plurality of decision circuits. The BERT provides the ability to supply additional information and feedback about the behavior and performance of the targeted device or subsystem being tested and to perform error measurements in non-constrained data (i.e. live data).

14 Claims, 5 Drawing Sheets

FIG.-10 ial Application Ser. No. 60/528,694, filed Dec. 10, 2003.

METHOD AND APPARATUS FOR USING DUAL BIT DECISIONS TO MEASURE BIT ERRORS AND EVENT OCCURRENCES

This application claims the benefit of U.S. Provisional Application Ser. No. 60/528,694, filed Dec. 10, 2003.

BACKGROUND OF THE INVENTION

1. Field of the Invention

This invention generally relates to systems that measure the performance of high-speed data communications channels. More particularly, the preferred embodiment of the present invention relates to a method and an apparatus for using dual bit detectors to measure bit errors and event occurrences in a data stream.

2. Description of the Related Art

In recent years, the performance of high-speed communication facilities or devices has risen to a point that the ability to accurately measure its quality has become an ever-increasing challenge. In the area of data communication devices, for example, efforts to reduce size and power while increasing the throughput of such devices has increased the possibility of error. Network suppliers, integrators and users alike want assurances that these devices will perform reliably and can accommodate data transmission rates that routinely exceed several gigabits/second. Providing such assurance requires determining the effective error rate of either the data received by or data transmitted through a high-speed communications channel or device.

One approach of evaluating the performance of a high-speed communications channel device or system is to use a bit error rate tester (BERT). Here, a predetermined bit pattern is transmitted through the target channel, device or system and on to the BERT. The difference between the known transmitted bit pattern and the expected bit stream is considered an error and is accumulated by the BERT to determine the effective bit error rate (i.e., the fraction of the received or transmitted bits that are in error) of the target device or system. Even though bit error rate testing (BER) is a relatively significant measure of performance, merely measuring the error rate of a high speed communications device or system does not provide enough data to characterize the behavior of a communications channel, device or system. As a result, instruments such as BERTs and oscilloscopes have the functionality of creating an eye diagram, jitter measurements, Q-factor measurements, voltage histograms, time histograms and mask tests to facilitate characterizing a high-speed communications device or system during the various stages of development. Here, various techniques that depend on knowing either the information on mismatches between the expected data stream and the received data stream or information about the occurrence of multi-valued voltages representing the data stream landing inside various time or voltage windows within the data eye diagram are the building blocks to better and more-detailed analysis methods. For production or manufacturing environments, generating a comprehensive series of tests that incorporate generating these various analysis techniques for each new component or communications subsystem is too costly and quite time consuming.

There are several commercially available testing systems that characterize and validate the performance of a data signal from a device or communications subsystem using bit error rate measurement methods. These include instruments from Agilent Technologies, Anritsu, SHF; eye diagram-creating oscilloscopes from Agilent Technologies, Tektronix, Lecroy Corporation; and jitter analyzers from Agilent Technologies, Wavecrest, and LeCroy Corporation. As understood, in each of these systems, non-overlapping techniques are used to create various methods for analyzing the quality of a digital communication stream, but, in no case, is a single instrument capable of performing measurements needed to do all the different desired measurements, nor are measurements always allowed in non-constrained (i.e. live) data streams.

What is needed is a single device that includes dual detectors having a dual bit decision tree enabling the user to perform comparative testing without the use of constrained references. What is also needed is a single such device that includes such dual detectors having a dual bit decision tree that can analyze live data.

SUMMARY OF THE INVENTION

BERTs are devices that measure the rate of error between an incoming data stream and the expected value of the incoming data stream. Expected values are typically known because the type of data that goes over the stream during the bit error rate tests is constrained to be a predictable pattern.

An object of the present invention is to provide a method and apparatus for measuring bit errors and event occurrences in multi-valued data streams without the requirement of having a constrained reference bit stream.

Another object of the present invention is to provide a BERT, which includes a dual detector system capable of analyzing live data.

Yet another object of the present invention is to provide a BERT with a dual detector system, which analyzes data using a flexible combination of voltage threshold and clock timing.

The BERT includes a plurality of decision circuits operative to provide a respective bit decision output signal in response to an input signal. The bit decision output signal magnitude information of a signal under test as measured over a sample window period. A comparator circuit is coupled to each of the plurality of decision circuits, and is operative to provide an event occurrence signal in response to the bit decision output signals from each of the plurality of decision circuits.

An advantage provided by the present invention is that it provides the ability to use both a constrained data bit stream and an "on-the-fly" the input or reference bit stream.

Another advantage provided by the present invention is that it accomplishes its objectives without using a constrained data bit stream, but rather has the ability to function solely using the "on-the-fly" the input or reference bit stream so that the expected value is determined each bit at a time in real time using live data.

The application of bit error rate testing in accordance with this invention depends on the general limitation that the bit errors being measured are a function relative of the differential between two points in the eye diagram. This depends upon where in the eye diagram the logical 1/0 decision is being made. For example, the logical 1/0 decision is sampled at an optimal location in the eye diagram, where the least noise occurs, typically the middle of the eye, the intended 1 or 0 level would be known. In this way, the bit choice in the middle of the eye would be the reference point from which comparisons could be made from any other point in the eye diagram. For example, a second bit decision would be made at a particularly noisy location in the eye. Then, the two bit error decisions could be compared and the reference input bit stream would be the self-created first bit decision (Bit decision A).

It is also an object of this invention to be able to efficiently measure the number of occurrences of the signal-under-test (SUT) multi-valued input that lands between any two selected voltages at some re-occurring sampling time in the eye diagram or that lands between any two sampling times at a given sampling voltage. By being able to measure the number of occurrences of the input signal at a specified location (voltage or time), probability distributions can be formed on either the voltage and/or time axis allowing the creation of voltage histograms, time histograms or two-dimensional eye diagrams.

Yet another advantage provided by the present invention is that the BERT conducts the desired tests without having to shut down the device under test due to the BERTs use of live data.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein.

DETAILED DESCRIPTION OF THE INVENTION

The present invention will now be described in greater detail with reference to FIGS. 1-10, which illustrate the preferred embodiments of the present invention. The present invention may, however, be embodied in many different forms and should not be construed as limited to the embodiments set forth herein; rather these embodiments are provided so that this disclosure will be thorough and complete and will fully convey the invention to those skilled in the art.

The invention will be described with respect to a method and apparatus used to measure errors and event occurrences in a multi-valued data stream using a binary decision circuit. By employing two parallel bit decision circuits where each bit decision point can be independently moved in time offset within the eye and voltage threshold within the eye one decision point can be moved to the optimized center of a data eye opening to create a reference data stream to compare another data stream generated by the other decision point which could be moved to varied locations around the eye. The two bit decision points must be closely integrated so that they can synchronized bit-for-bit so that you know you are comparing the result of a "reference" bit decision with the "user" bit decision for each bit cell. "Reference" bit decisions can be used as the expected data stream for a bit error decision or can be used as boundary threshold when trying to count the number of multi-valued signals that crossed one boundary but may have not crossed another boundary (e.g. when counting the number of multi-valued signals that fell in between two boundaries).

Additionally, in order to fully appreciate the present invention reference is made to three other inventions by the same patentee. Each of these inventions has been embodied in three separate patent applications, U.S. patent application Ser. No. 09/996,342, entitled, "Apparatus And Method For Sampling Eye Diagrams With Window Comparators", filed Nov. 21, 2001; U.S. patent application Ser. No. 10/099,487 entitled "A Method And System For Creating An Eye Diagram Using A Binary Data Bit Decision Mechanism", filed Mar. 15, 2002; U.S. patent application Ser. No. 10/097,706 entitled "A Method And Apparatus For Determining The Errors Of A Multi-Valued Data Signal That Are Outside The Limits Of An Eye Mask", filed Mar. 14, 2002. Each of these applications is specifically incorporated herein by reference in its entirety for the purpose of not only explaining the detailed working of this invention, but for any and all purposes consistent with the prosecution of this application and full disclosure, so that one of ordinary skill in the art may better understand and appreciate the invention herein.

Figure 1:
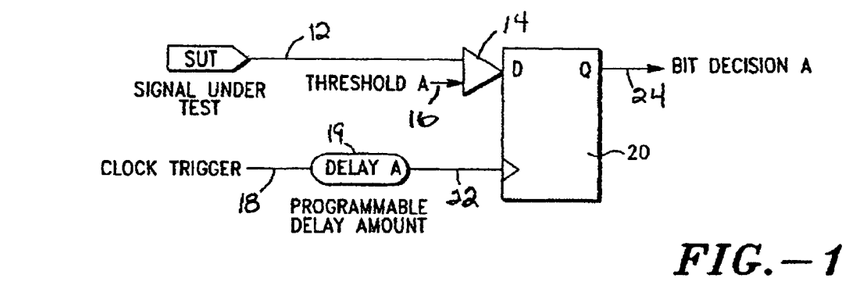
FIG. 1 illustrates in schematic form, a known single binary decision circuit.

For a more complete understanding of the BERT in accordance with this invention, the functionality of a single decision detector will be explained with respect to FIG. 1. A signal under test (SUT) 12 is provided as a first input of a comparator 14. A threshold or reference signal 16, having a predetermined reference value (Threshold A), is provided as a second input of the comparator 14. The comparator 14 may be any suitable device, for example, an operational amplifier that is capable of comparing the SUT 12 and the threshold signal 16, to generate an error signal 15 that is provided as an output. The error signal 15 is provided to the data ("D") input of a D Flip-Flop 20. Thus, any differences between the SUT 12 and the reference signal 16 will be provided to the Flip-Flop 20.

A clock trigger signal 18 is provided as a first input to a programmable delay circuit 19. The second input of the programmable delay circuit 19 is coupled to a programmable delay signal 21. The output of the programmable delay circuit 22 is provided to the clock (CLK) input of the Flip-Flop 20. In operation, the clock trigger signal 18 acts as a trigger, which causes the error signal 15 to transfer from the data input of the Flip-Flop 20 to the output of the Flip-Flop 20. Application of the clock trigger signal 18 to the CLK input of the Flip-Flop 20 is delayed by an amount corresponding to the programmable delay signal 21. The error signal 15 and the delayed clock trigger signal 22 comprise a multi-valued data stream 23 of the present invention. The output of the Flip-Flop 20 is referred to as a Bit Decision (Bit Decision A) Signal 24.

The Bit Decision Signal 24 will be a logic 1 if and only if the SUT 12 has a value that exceeds the value (for example, in Volts) of the threshold or reference signal 16 at the time defined by the delayed clock trigger signal 22. Similarly, the Bit Decision Signal 24 will be a logic 0 if and only if the SUT 12 has a value that is less than the value (for example, in Volts) of the threshold or reference signal 16 at the time defined by the delayed clock trigger signal 22

Figure 2:
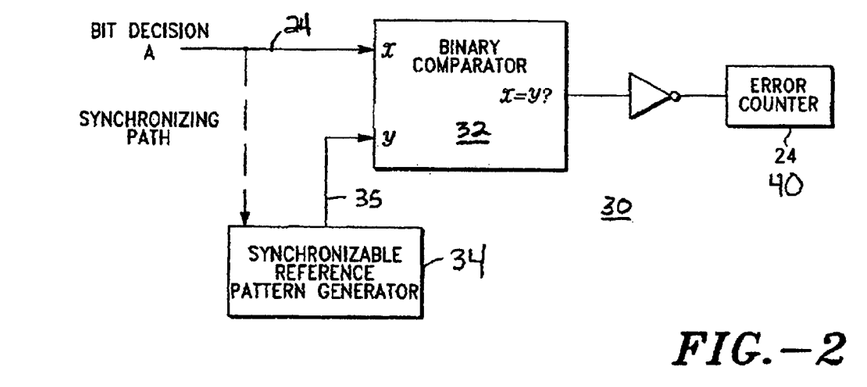
FIG. 2 illustrates a known bit error rate detector comparing a constrained reference bit stream to the actual bit stream of the device under test.

FIG. 2 illustrates a bit error rate detector 30 configured to compare a constrained reference bit stream to the bit stream of the device (or signal) under test. The error rate detector 30, includes a binary comparator 32, having a first input (labeled "x") and a second input (labeled "y") the first input ("Input x") of the binary comparator 32 receives the Bit Decision Signal 24. A synchronizable reference pattern generator circuit 34 generates a reference pattern signal 35, which is provided to the second input ("Input y") of the binary comparator 32. In BERTs employing a single binary comparator as illustrated in FIG. 2, the reference pattern signals 35 are constrained within the reference pattern generator circuit 34. Such reference patterns 35 are known as constrained patterns As will be appreciated more fully, the BERT in accordance with the present invention does not require such constrained patterns, but rather can use "on the fly" patterns to perform its functions.

The reference pattern generator circuit 34 is implemented by a data stream generating element which is capable of generating the known constrained data types which modern bit error rate testers must use when measuring bit error rate as noted above. The constrained data types typically include pseudo-random data sequences constrained by the polynomials used inside the linear mathematics when making the data sequence (often implemented with linear feedback shift registers). The constrained data sequences also often include user-provided data sequences that are constrained to fit within a certain memory size and therefore will repeat on the memory length boundary. Requiring a reference pattern generator 34 inside an error detector 30 is a result of the fact that you must know the expected data values provided to the inputs of the binary comparator 32 in order to know if you have a miss-match with the received data (i.e. an error) signal 24.

The reference pattern generator circuit 34 must also provide the ability to be synchronize-able to the incoming data sequence. That is, the reference data sequence needs to generate the same sequence as the expected data sequence and to generate it at the same bit phase offset so that the two signals can be compared. This is analogous to having a signal under test being a counting sequence from 0 to 100 and having the reference pattern generator 34 know that it is a counting sequence, but having to listen to a sample of the input signal under test in order to synchronize to where in the count sequence the user's signal under test is. In this fashion, once the reference pattern generator 34 knows one count value successfully, it can predict the next expected reference pattern as the next count sequence and can continue from there on providing expected values.

When the signal values present on the first and second inputs of the binary comparator 32 are not equal, an error counter 40 is incremented. Errors are defined as the values presented at the first input and second inputs of the binary comparator 32 being different. In this manner, errors between the incoming multi-valued data sequence 24 and the expected data sequence 35 are accumulated and counted.

Figure 3:
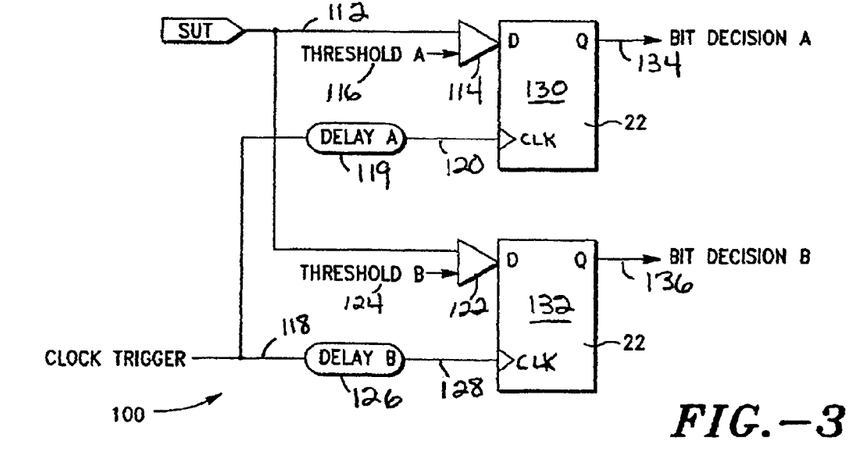
FIG. 3 is a schematic illustration of the BERT in accordance with this invention having a dual-decision data detector.

FIG. 3 is a schematic illustration of a dual-decision BERT. The BERT 100 includes a first binary comparator 114 and a second binary comparator 122. Each of the binary comparators 114, 122 receives the same SUT 112. The SUT 112 is provided as a first input to the first binary comparator 114. A first threshold or reference signal 116 is provided as a second input to the first binary comparator 114. The first threshold or reference signal 116 may be either a fixed value, or a programmable value. The first binary comparator 114 may be any suitable device, for example, an operational amplifier that is capable or comparing the SUT 112 and the first threshold signal 116, and generating an error signal 115 which is a measure of the differences between, for example, the voltage of the SUT 112 and that of the first reference signal 116, and providing such difference as an output. The error signal 115 is provided to the data ("D") input of a first decision circuit, for example, D flip-flip 130. Thus, any differences between the SUT 112 and the reference signal 116 will be provided to the D flip-flop 130.

A clock trigger signal 118 is provided as a first input to a first delay element 119, which generates a first delayed trigger signal 120, which in the preferred embodiment, is a delayed version of the clock trigger signal 118 that is provided to the clock (CLK) input of the first flip-flop 130 and used to control when the error signal 115 present at the data input of the first flip-flop 130 is provided as the first Bit Decision Output signal 134. The value (or delay) provided by the first delay element 119 may be varied and set to the desired level by the user, depending upon what type of test is desired to be run. For example, the value of the first delay element 119 sets the time offset within the bit window where the logical decisions would be made for comparator 114. When making a bit error rate measurement on live data near the edges of an eye diagram, the amount of delay provided by the first delay element 119 would be set to center of the sampling time in the middle of the open eye.

The SUT 112 is also provided as a first input of second comparator 122. A second threshold or reference signal 124 is provided as a second input to the second comparator 122. The second threshold or reference signal 124 may be either a fixed value, or a programmable value. The second binary comparator 122 may be any suitable device, for example, an operational amplifier that is capable or comparing the SUT 112 and the second threshold signal 124, and generating a second error signal 125 which is a measure of the differences between, for example, the voltage of the SUT 112 and that of the second reference signal 124, and providing such difference as an output. The second error signal 125 is provided to the data ("D") input of a second decision circuit, for example, D flip-flip 132. Thus, any differences between the SUT 112 and the second reference signal 124 will be provided to the second D flip-flop 132.

The clock trigger signal 118 is provided as a first input to a second delay element 126, which generates a second delayed trigger signal 128, which in the preferred embodiment, is a delayed version of the clock trigger signal 118 that is provided to the clock (CLK) input of the second flip-flop 132 and used to control when the error signal 125 present at the data input of the second flip-flop 132 is provided as the second Bit Decision Output signal 136. The value (or delay) provided by the second delay element 126 may be varied and set to the desired level by the user, depending upon what type of test is desired to be run. For example, the value of the first delay element 119 sets the time offset within the bit window where the logical decisions would be made for the first comparator 114. When making a bit error rate measurement on live data near the edges of an eye diagram, the amount of delay provided by the first delay element 119 would be set to center of the sampling time in the middle of the open eye and the amount of delay provided by the second delay element 126 would be set to correspond to the desired sampling time near the edge of the eye diagram.

It will be appreciated by those of ordinary skill in the art that the reference or threshold signal values 116, 124 may be set to the desired level by the user depending upon what type of test is desired to be run. For example, to measure bit error rates near the edges of an eye diagram with live data, the first threshold signal value 116 would be set to the center of the eye to create a clean reference and the second threshold signal value 124 would be set to the place in the eye where the bit error rate measurement was desired to be made. Although the BERT 100 is illustrated as having decision circuits 130, 132 comprised of D flip-flops, such decision circuits 130, 132 may be implemented by other suitable devices, for example, discrete logic comparators configured with external sampling flip-flop devices or other suitable device and/or combinations thereof.

As illustrated, the clock trigger signal 118 is provided as the second input to the first and second decision circuits 130,132, after being delayed by a given time interval by a corresponding first delay element 119 and second delay element 126. The amount of delay provided by each delay element 119,126 may be varied and set to the desired level by the user, depending upon what type of test is desired to be run. For example, the value or amount of delay provided by each delay element sets the time offset within the bit window where the logical decisions would be made for the first decision circuit 130 and second decision circuit 132, respectively. When making a bit error rate measurement in live data near the edges of an eye diagram, the amount of delay provided by the first delay element 119 would be set to center the sampling time in the middle of the open eye and the amount of delay provided by the second delay element 126 would be set to correspond to the desired sampling time near the edge of the eye diagram.

It will be noted and appreciated that each of the decision circuits 130, 132 of the BERT 100 has independent control over both the sampling time offset, as provided by the first delay element 119 and the second element 126 and the logic voltage threshold, as provided by the first binary comparator 114 and the second binary comparator 122 while examining the same SUT 112. In this way, two bit decisions 134, 136 are simultaneously created from two potentially different locations within the eye diagram. The results of both decision circuits 134, 136 are simultaneously created and available to make future digital logic processing decisions.

Figure 4:
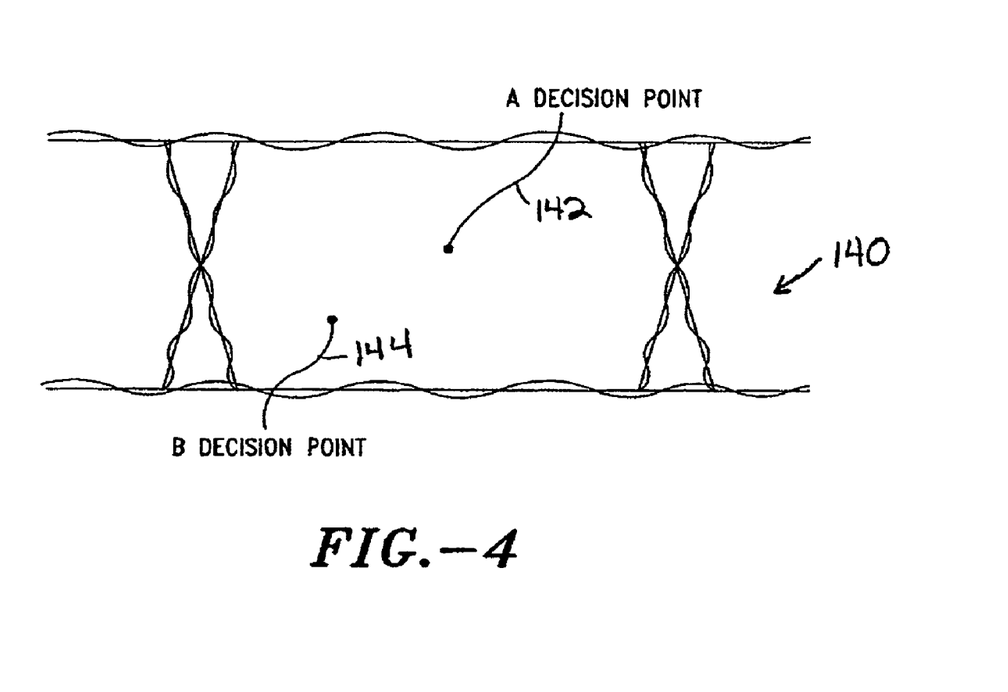
FIG. 4 is a schematic illustration of a two decision bit points in an eye diagram using the BERT in accordance with this invention having two binary decision circuits that are independently moved about the eye diagram using voltage threshold and time offset within the bit period space to define the two separate decision points.

FIG. 4 is a schematic illustration of two decision bit points in an eye diagram using the dual detector BERT 100 (FIG. 3) according to an exemplary embodiment of the present invention. As shown, the Decision Point A 142 has been set in the open "middle" of the eye diagram 140. As is well known in the art, the middle of the eye diagram has the least amount of noise. Thus, this decision point 142 has the highest probability of making the best, cleanest, bit decisions of any point in the eye diagram 140. The further away from the middle of the eye diagram, the greater the noise. At the edges of the eye diagram, typically the most noise is found.

Decision Point B 144 is set to be potentially influenced by the noisy edges of the multi-valued data transitions, which are expected to cause a higher probability of bit errors in the detected bit values. Note that Decision Point B 144 could be placed anywhere within the allowed voltage threshold and time offset ranges of the data bit. This creates a stream of decisions that correspond to the logical decisions that result from comparing the input multi-valued data signal at that time offset within the bit window and that logical voltage threshold.

Figure 5:
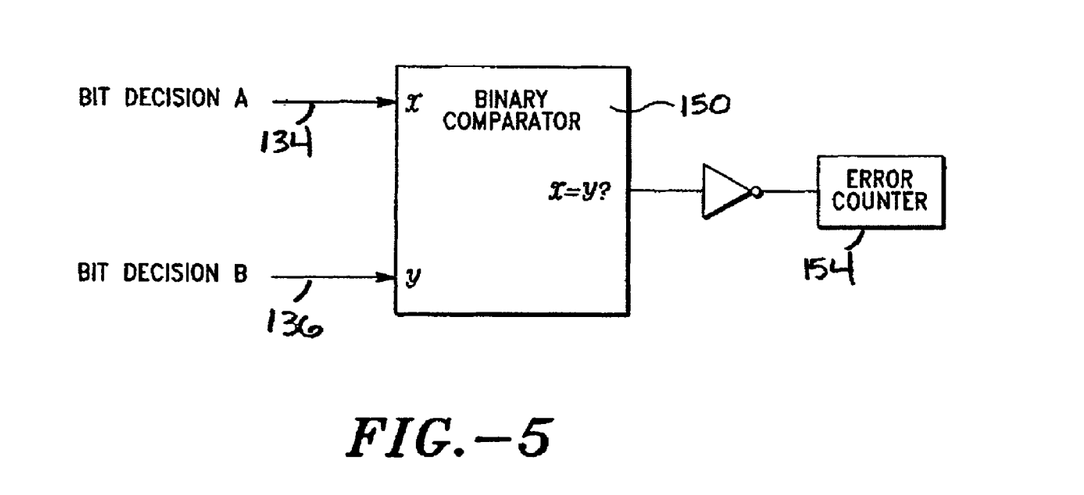
FIG. 5 is a schematic illustration of the BERT in accordance with this invention which uses an "on the fly" reference bit stream generated from the second binary bit decision circuit for conducting the test live.

FIG. 5 is a schematic block diagram of the BERT according to an exemplary embodiment of the present invention using on the fly reference bit streams when conducting live data error detection and occurrence testing. As show, the first Bit Decision Output signal 134 is provided to a first input of a binary comparator circuit 150. The second Bit Decision Output signal 136 is provided to the second input of the binary comparator circuit 150. In this embodiment, and in accordance with the present invention, the second Bit Decision Output signal 136 from the second decision circuit 132 (FIG. 4) replaces the constrained reference data signal illustrated in FIG. 2. When the signal values present at the first (e.g. "x") and second (e.g. "y") inputs are not equal, an error counter 154 is incremented. Errors are defined as the values presented at the first and second inputs of the binary comparator 150 being different. Thus, according to the present invention error, detection and counting and accumulation testing is performed on live data, not constrained data as is done in conventional bit error testing devices. Further, the voltage or other suitable magnitude characteristic provided by the first Bit Decision Output signal 134 and the timing characteristic provided by the second Bit Decision Output signal 136 are independent of one another and independent of the type of reference data sequence being used for the test and requires no constraint on the reference data sequence.

The second (or "y") input of the binary comparator 150 is used as the reference data sequence. The reference data sequence is generated from a binary decision made at the desired location in the middle of the eye. In this exemplary embodiment, the bit decisions made at Decision Point A 142 (FIG. 4), which corresponds to the first Bit Decision Output Signal 134 are compared to the binary bit decisions made at Decision Point B 144 (FIG. 4), which corresponds to the second Bit Decision Output Signal 136. If these two bit decisions result in a miss-match, then an error is counted. Because the reference bit pattern is determined "on the fly", this allows miss-matched (e.g. errors) to be counted independent of the type of reference data sequence being used for the test and requires no constraint on the reference data sequence.

Figure 6:
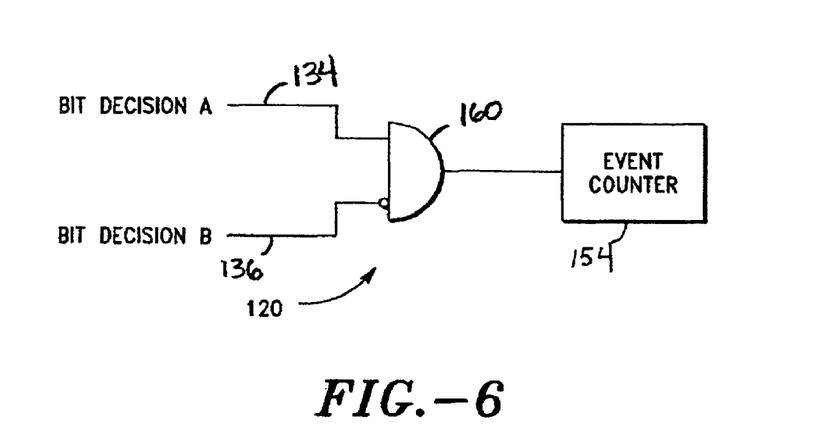
FIG. 6 illustrates a comparison of the first and the second bit decision points recorded in an event counter.

FIG. 6 is an illustration of a comparison of the first and second bit decision points recorded in an event counter. As show, the first Decision Output Signal 134 is provided at a first input of binary decision circuit 160. The second Decision Output Signal 136 is provided at an inverted second input of the binary decision circuit 160. In application, the multi-valued input signals under test that cross the first reference or threshold voltage at the defined time offset within the bit window (Threshold A-116 (FIG. 3)) will result in a logical 1 at the first input. Multi-valued input signals user test that do not cross the second reference or threshold voltage at the defined time offset within the bit window (Threshold B-124 (FIG. 3)) will result in a logical 0 at the second input. The logical combination as shown in FIG. 6 (A AND (NOT B)) in this case yields a logical 1, which causes the event counter 154 to increment. In this way, occurrences of the multi-valued input signal under test (SUT) that fall between the first threshold or reference voltage and the second threshold or reference voltage at the defined time offset within the bit window will be counted.

Similarly when the first and second threshold or reference voltage values are set to be equal, the multi-valued input signals under test that cross the voltage threshold at the defined time offset within the bit window will results in the first Bit Decision Output signal 134 having a value of logical 1. Multi-valued input signals user test that do not cross the voltage threshold at a different time offset within the bit window will result in the second Bit Decision Output signal 136 having a value of logical 0. The logical combination (A AND (NOT B)) in this case yields a logical 1, which causes the event counter 154 to increment. In this manner, occurrences of the multi-valued input signal under test SUT that fall between the first time offset or delay interval 119 and the second time offset or delay interval 126 at the corresponding defined voltage threshold will be counted.

Figure 7:
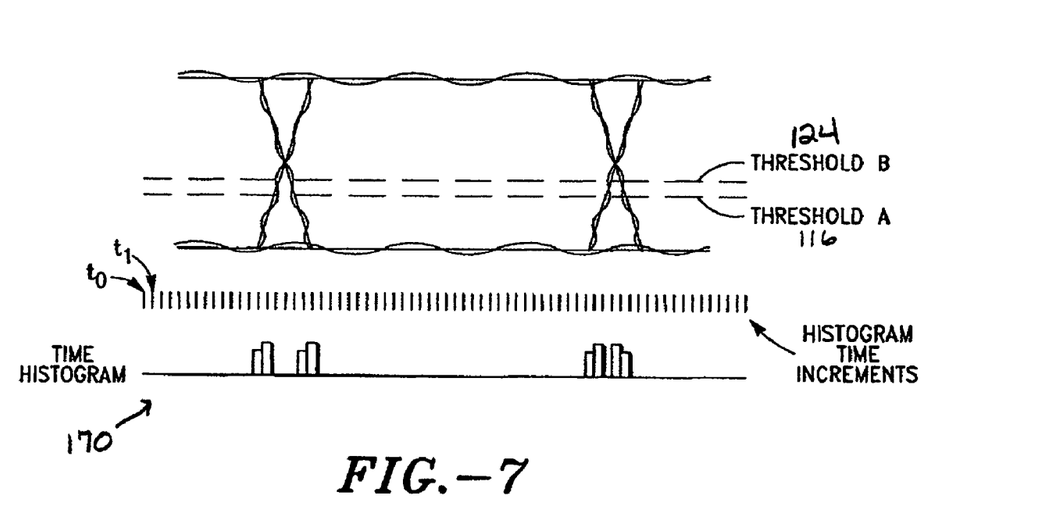
FIG. 7 illustrates a sample time histogram generated from a comparison of the two bit decision points accumulated by incrementally measuring event occurrences at the histogram time increments at a given voltage threshold.

FIG. 7 is a time histogram 170 generated by the BERT according to the present invention. Time histograms show the number of occurrences 172-178 of the multi-valued signal under test (SUT) that falls within a minimum (Thresh A) 116 and maximum (Thresh B) 124 voltage range at small increments of time. To perform this complex measurement, individual measurements must be made at each fine increment in time to measure the number of events to be displayed at that increment position on the histogram. The first or minimum threshold (Thresh A) value 116 and the second or maximum threshold (Thresh B) values 124 are set to define the min and max boundaries of the vertical limits for the histogram region. A measurement is performed for a prescribed period of time that sets the first delay value 119 (FIG. 3) at $T_0$ and the second delay value 126 (FIG. 3) at $T_1$ and counts the number of occurrences. Once the prescribed period of time for the measurement has passed, the occurrence count can be used for the histogram entry at position $T_0$ and then the delay offsets are both incremented by a time $T_{Delta}=T_1-T_0$. This continues until occurrence counts for the entire histogram range have been accumulated.

Figure 8:
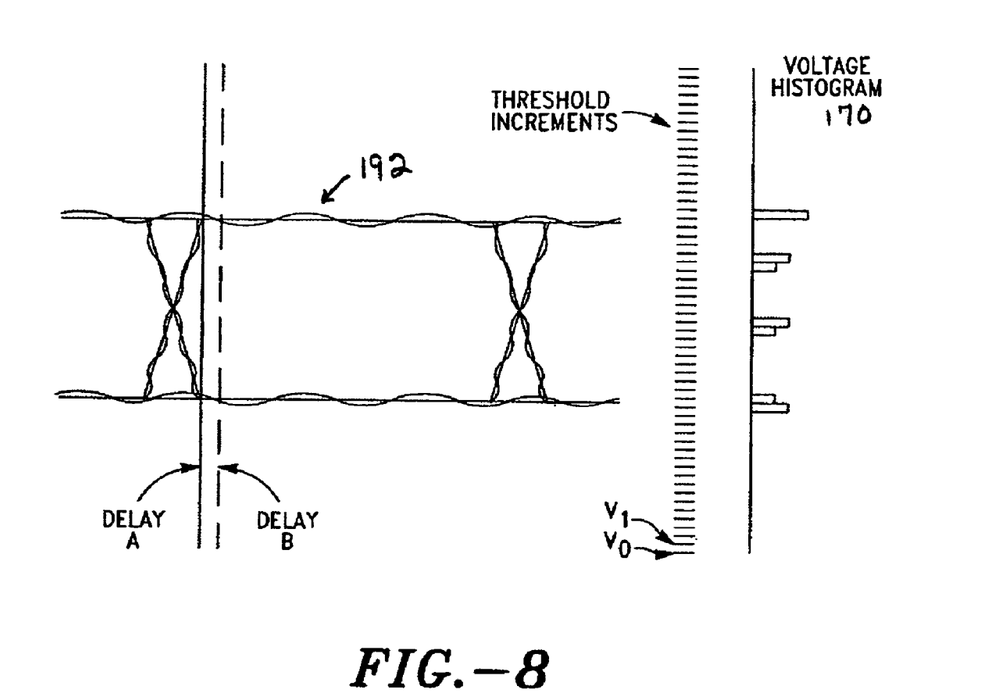
FIG. 8 illustrates a sample voltage histogram generated from a comparison of the two bit decision points accumulated by incrementally measuring event occurrences at the histogram voltage increments at a given time offset within the data bit period.

FIG. 8 is an illustration of a voltage histogram 190 derived from the eye diagram 192 in that figure. The functionality of the invention allows the creation of such a voltage histograms. The voltage histogram 190 shows the number of occurrences of the multi-valued signal under tests that falls within a minimum (Delay A) and maximum (Delay B) time offset range at small increments of voltage. To perform this complex measurement, individual measurements must be made at each fine increment in voltage (referred to as the resolution) corresponding to the range of the voltage histogram desired divided by the number of histogram points desired to measure the number of events to be displayed at that increment position on the histogram. The minimum (Delay A) value and the maximum (Delay B) values are set to define the min and max boundaries of the horizontal limits for the histogram region. A measurement is performed for a prescribed period of time that sets the first (Threshold A) value at $V_0$ and the second (Threshold B) value at $V_1$ and counts the number of occurrences. Once the prescribed period of time for the measurement has passed, the occurrence count can be used for the histogram entry at position $V_0$ and then the voltage thresholds are both incremented by a voltage $V_{Delta}=V_1-V_0$. This continues until occurrence counts for the entire histogram range has been accumulated.

Figure 9:
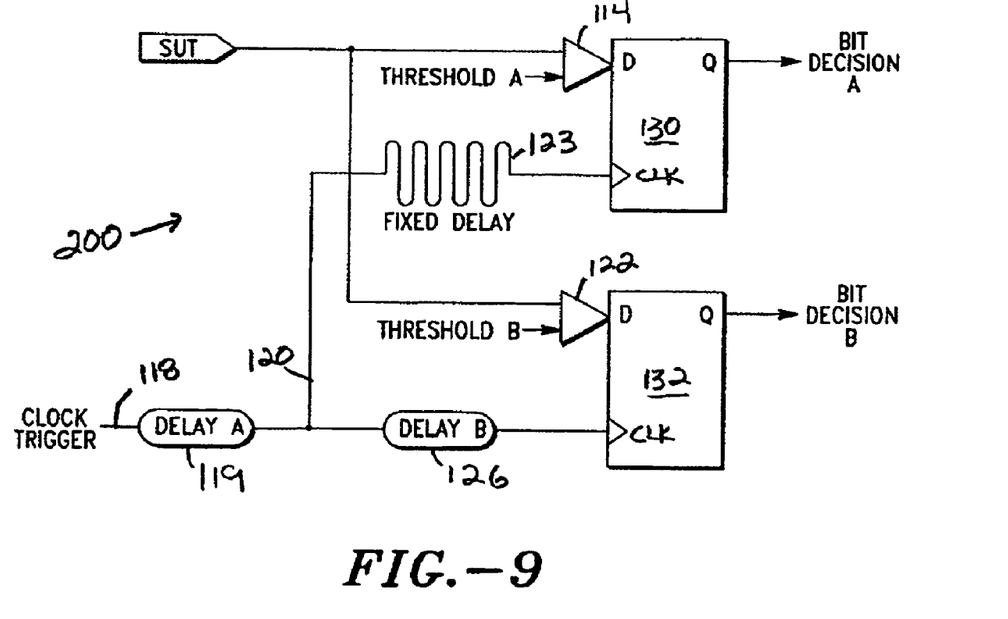
FIG. 9 illustrates a preferred embodiment of the BERT in accordance with this invention having variable delay configurations for implementing the same dual decision circuit.

FIG. 9 is a schematic block diagram of a dual decision BERT according to an alternate embodiment of the present invention. This alternate configuration allows the BERT 200 to independently set the sampling time offset within the bit window for each of the two binary decision circuits. As a result of the functionality of the BERT 200 in accordance with the invention, different variable total delay amounts 119, 126 are able to be provided in the clock trigger signal 118 paths to each flip flop 130, 132 clock (CLK) input. As illustrated in this figure, the first binary decision circuit includes, but is not limited to, the combination of the first comparator circuit 114 and the first flip-flip 130. In similar fashion, the second binary decision circuit includes, but it not limited to, the combination of the second comparator circuit 122 and the second flip-flop 132. The aforementioned components may be included in a single circuit package, or can be provided by interconnected separate circuit packages. In an alternate embodiment, the fixed delay element 123 may be included in the same package as the first comparator circuit 114 and the first flip-flop 130. Alternately, the second programmable or adjustable delay element 126 may be included in the same package as the second comparator 122 and the second flip-flop 132.

As compared to the embodiment illustrated in FIG. 3, in this alternate embodiment, the programmable or adjustable delay element 119 is in common to the clock (CLK) inputs of the first flip-flop 130 and the second flip-flop 130. An extra programmable or adjustable delay element 126 is provided in the path between the delayed clock trigger signal 120 and the clock (CLK) input of the second flip-flop 132. Within the first decision circuit, a fixed delay element 123 is placed in the path between the delayed clock trigger signal 120 and the clock (CLK) input of the first flip-flop 130 to make up for the minimal delay provided by the second delay element 126. This assists in getting very accurate relative delay settings independent of possible variations introduced by the variable delay elements. To set a delay for the first binary decision circuit, the setting is made to the first delay element 119; to set the delay for the second binary decision circuit you set or otherwise adjust the second delay element 126 setting for example, by inserting a fixed time delay or providing a control signal (not shown) that alters the delay period provided by a programmable delay element. The second delay element 126 setting, then, is in addition to the first delay element 119 setting. This provides independent settings of delay offset within the bit window.

Figure 10:
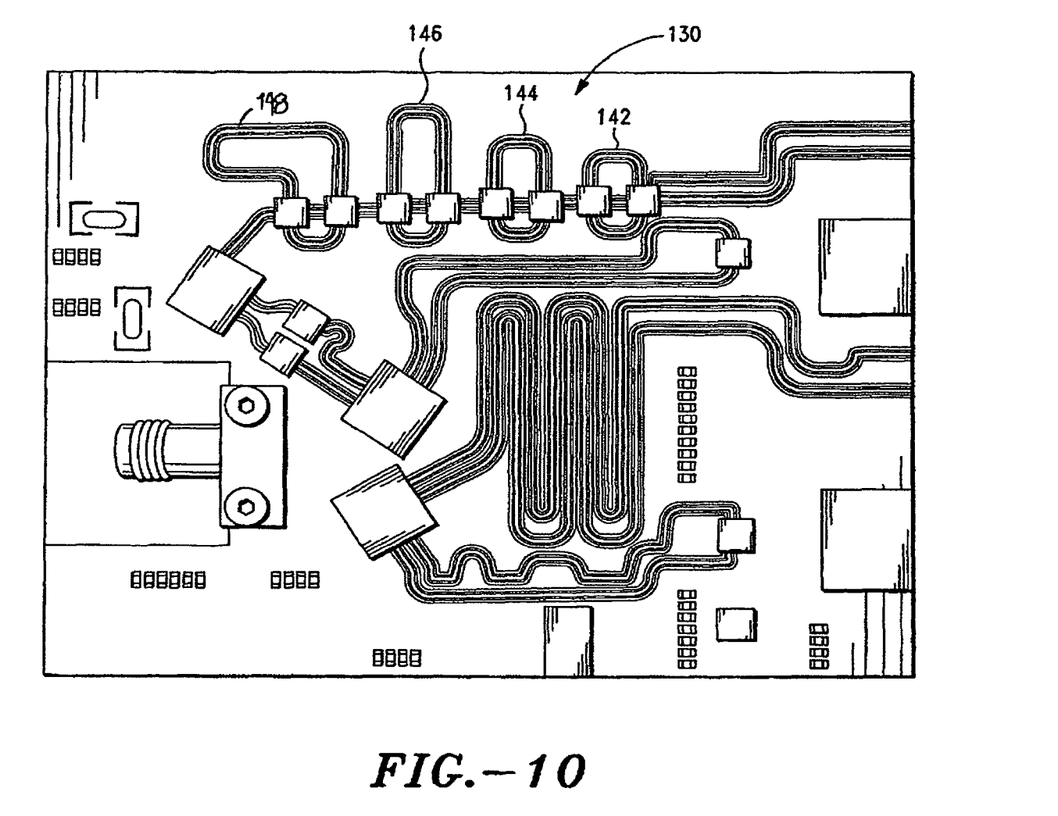
FIG. 10 is an actual photograph of the partial dual decision circuit currently found in the prototype of the invention, exclusive of the B delay circuit.

FIG. 10 is a copy of a photograph of a prototype circuit of an exemplary device in accordance with this invention. The dual decision flip flops are appropriately indicated as shown. The first delay element is also shown and indicated generally by numeral 130. In this exemplary embodiment, there are four pairs of switches 142, 144, 146 and 148. Each is tied together by a circuit. However, before spilling its output over to the next pair, the output is passed through one of two delay circuits. As can be seen each pair has a short delay circuit 140 or a progressive longer delay circuit denoted respectively, 142, 144, 146 and 148. As will be appreciated by those skilled in the art, the second delay element is identical in this exemplary embodiment, but need not be so limited with the scope of the invention.

While the foregoing describes several embodiments of a BERT in accordance with the present invention, it is to be understood that the above description is illustrative only and not limiting of the disclosed invention. It will be appreciated that it would be possible for one skilled in the art to modify a number of aspects of the BERT within the spirit and scope of the invention. Additionally, the specific time delays and other example set forth in the foregoing description are illustrative only and may be modified within the spirit and scope of the invention. Accordingly, the present invention is to be limited only by the claims as set forth below.

What is claimed is:

1. A bit error rate tester circuit, comprising:
a plurality of decision circuits, each operative to provide a respective bit decision output signal corresponding to an input signal in response to a clock trigger signal representing a time offset sampling point within a sampling window period, each of the bit decision output signals being provided independent of one another and including non-constrained input signal magnitude information measured over the sampling window period; and a comparator circuit, operative to provide an event occurrence signal in response to the bit decision output signals from each of the plurality of decision circuits.

2. The bit error rate tester circuit of claim 1, further including an error counter circuit operative to accumulate the number of error events within the sampling window period in response to the event occurrence signal.

3. The bit error rate tester circuit of claim 1, wherein the decision circuit includes:
a first comparator operative to generate an error signal in response to differences between the input signal and a first non-constrained threshold value;
a first delay element operative to provide a delayed clock trigger signal in response to a clock trigger signal; and
a first decision circuit, coupled to the first comparator, operative to generate a first decision output signal in response to the error signal and the delayed clock trigger signal.

4. The bit error rate tester circuit of claim 3, wherein the first non-constrained threshold value is a voltage magnitude.

5. The bit error rate tester circuit of claim 1, wherein the decision circuit includes:
a second comparator operative to generate a second error signal in response to differences between the input signal and a second non-constrained threshold value;
a second delay element operative to provide a second delayed clock trigger signal in response to a clock trigger signal; and
a second decision circuit, coupled to the first comparator, operative to generate a second decision output signal in response to the second error signal and the second delayed clock trigger signal.

6. The bit error rate tester circuit of claim 5, wherein the second non-constrained threshold value is a sampling time period.

7. The bit error rate tester circuit of claim 3, wherein the first delay element further includes a programmable device operative to adjust the amount of delay applied to the clock trigger signal in response to a control signal.

8. The bit error rate tester of claim 5, wherein the second delay element further includes a programmable device operative to adjust the amount of delay applied to the clock trigger signal in response to a control signal.

9. A dual decision circuit, comprising:
a first comparator operative to generate a first error signal in response to differences between an input signal and a first non-constrained threshold value;
a first delay element operative to provide a first delayed clock trigger signal representing a first time offset sampling point within a sampling window period in response to a clock trigger signal;
a first decision circuit, coupled to the first comparator, operative to generate a first decision output signal in response to the first error signal and the first delayed clock trigger signal;
a second comparator operative to generate a second error signal in response to differences between the input signal and a second non-constrained threshold value;
a second delay element operative to provide a second delayed clock trigger signal representing a second time offset sampling point within a sampling window period in response to a clock trigger signal; and
a second decision circuit, coupled to the second comparator, operative to generate a second decision output signal in response to the second error signal and the second delayed clock signal, wherein the first error signal and the second error signal are generated simultaneously and independently of one another.

10. The dual decision circuit of claim 9, wherein the first non-constrained threshold value is a voltage magnitude.

11. The dual decision circuit of claim 9, wherein the second non-constrained threshold value is a sampling time period.

12. The dual decision circuit of claim 9, wherein the first and second delay elements further include a programmable device operative to adjust the amount of delay applied to the clock trigger signal in response to a control signal.

13. The dual decision circuit of claim 9, wherein the first delay element is a fixed delay element, and wherein the circuit further includes a third delay element that is cascaded with the fixed delay element to provide the first delayed clock trigger signal.

14. The dual decision circuit of claim 13, wherein the third delay element is cascaded with the second delay element to provide the second delayed clock trigger signal in response to the clock trigger signal.

* * * * *